(12) United States Patent
Shimoyoshi

(10) Patent No.: US 8,096,047 B2
(45) Date of Patent: Jan. 17, 2012

(54) ELECTRONIC COMPONENT MOUNTING APPARATUS

(75) Inventor: Mitsuaki Shimoyoshi, Yamanashi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/762,458

(22) Filed: Apr. 19, 2010

(65) Prior Publication Data

US 2010/0263209 A1    Oct. 21, 2010

(30) Foreign Application Priority Data

Apr. 17, 2009    (JP) .................................. 2009-100519

(51) Int. Cl.
*H05K 3/30*    (2006.01)
(52) U.S. Cl. ............. 29/832; 29/564; 29/564.1; 29/825
(58) Field of Classification Search .................... 29/825, 29/832, 840, 564, 564.1
See application file for complete search history.

(56) References Cited

U.S. PATENT DOCUMENTS

| 4,604,966 A | * | 8/1986 | Kohn | ............................. 118/406 |
| 5,436,028 A | * | 7/1995 | Becher et al. | ................ 427/98.4 |

FOREIGN PATENT DOCUMENTS

| JP | SHO64-042196 A | | 2/1989 |
| JP | 2001-015533 A | | 1/2001 |
| WO | 2008/032755 A1 | * | 3/2008 |

* cited by examiner

*Primary Examiner* — Carl Arbes
(74) *Attorney, Agent, or Firm* — Pearne & Gordon LLP

(57) ABSTRACT

An electronic component mounting apparatus 1 includes a substrate conveyance mechanism 14 for conveying substrates 13 and 13*a*; a first drawing head 4 for supplying the substrate 13 with paste at a mounting position; a second drawing head 5 for supplying the paste to the substrate 13*a* at a pre-paste supply position closer to a conveyance starting side rather than to the mounting position; and a bonding head 3 that mounts, at the mounting position, electronic components on the substrate 13*a* supplied with the paste at the pre-paste supply position.

4 Claims, 3 Drawing Sheets

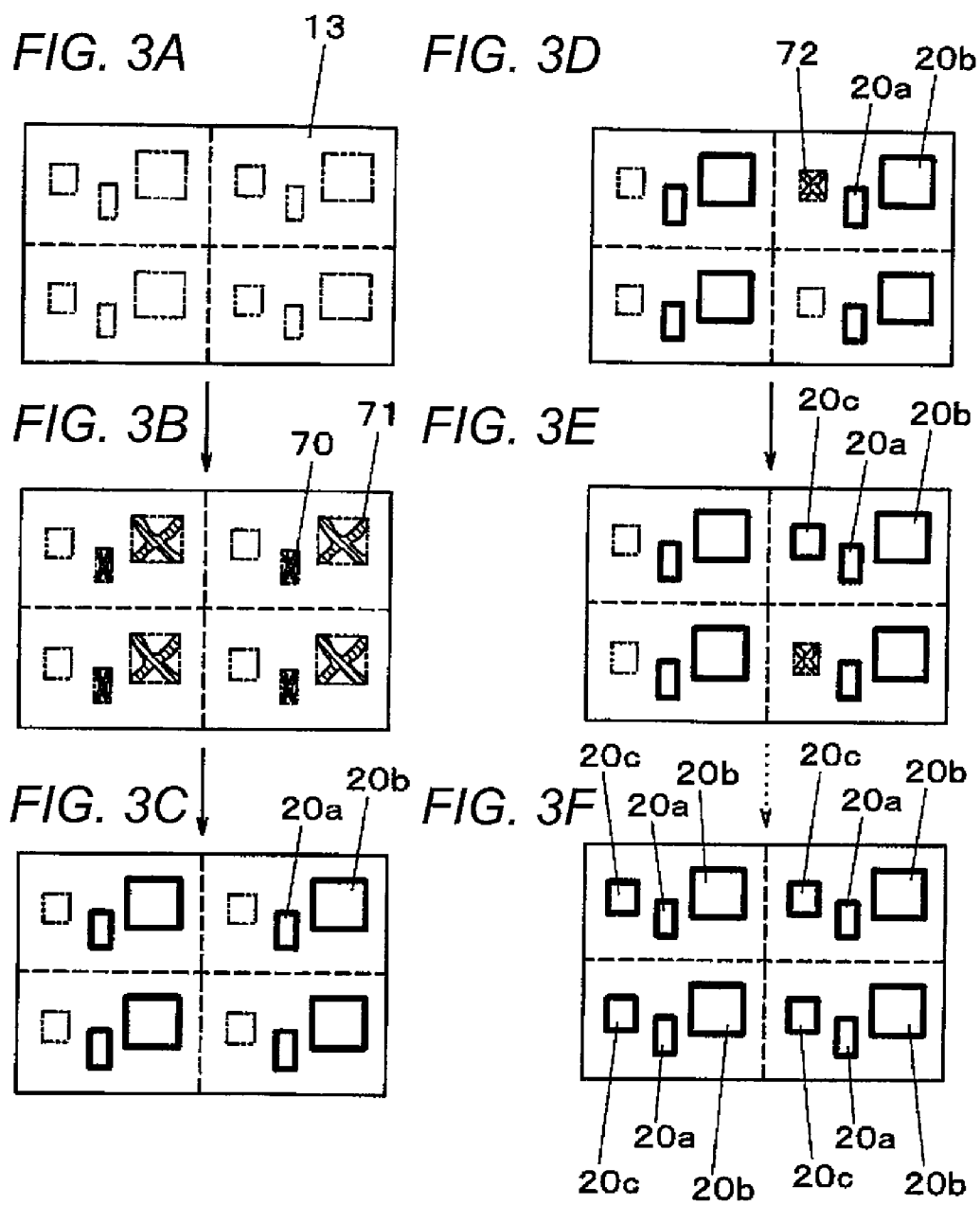

ELECTRONIC COMPONENT MOUNTING APPARATUS

BACKGROUND OF THE INVENTION

1. Field of the Invention

The present invention relates to an electronic component mounting apparatus that mounts electronic components after paste has been supplied to a substrate.

2. Description of the Related Art

A hitherto practiced method for mounting electronic components on a substrate by use of a paste-like adhesive (hereinafter abbreviated as a "paste") includes supplying a substrate with paste at a position that is closer to a conveyance start side than to a position where electronic components are actually mounted on the substrate along a direction of conveyance of the substrate and conveying the substrate supplied with the paste to the mounting position (see Patent Document 1).

Patent Document 1: JP-A-2001-15533

Silver paste, which is produced by mixing an adhesive resin and a silver filler into a solvent, is frequently used as related-art paste. However, an amount of solvent is relatively decreased by a recent increase in silver filler content intended for enhancing heat radiation. For this reason, the related-art paste supplying method has a potential of a solvent evaporating before a substrate arrives at a mounting position, which in turn raises a concern about deterioration of mounting quality caused by use of dry paste. An effective solution of the problem is to alternately provide a supply of paste and mount electronic components, thereby preventing occurrence of a time difference between the supplying operation and the mounting operation. However, when a plurality of electronic components are handled, extremely much time is required. In a production environment where paste containing a low proportion of silver filler is also used, further deterioration of productivity occurs, so that the solution is not rational.

SUMMARY OF THE INVENTION

The present invention aims at providing an electronic component mounting apparatus that enables selection of a supplying method appropriate for the property of paste, thereby maintaining mounting quality and enhancing productivity.

The invention provides with an electronic component mounting apparatus, comprising a substrate conveyance section that conveys a substrate, a first paste supply section that supplies a paste to the substrate or an electronic element provided on the substrate at a first position, a second paste supply section that supplies a paste to the substrate or the electronic element at a second position that is closer to a conveyance starting side rather than to the first position, and an electronic component mounting section that mounts, at the first position, an electronic component onto the substrate or the electronic element supplied with the paste at the second position.

According to the present invention, paste can be supplied at two positions; namely, a mounting position and a pre-paste supply position. Hence, it is possible to select a supply method that maximizes production efficiency according to type and property of paste. In particular, when slowly-drying paste and quick-drying paste are simultaneously used for one substrate, the slowly-drying paste is supplied at the pre-paste supply position, and the quick-drying paste is supplied at the mounting position, whereby a wait time is effectively utilized, and a time during which the substrate stays at the mounting position can be shortened.

BRIEF DESCRIPTION OF THE DRAWINGS

FIG. 3 is a descriptive view of a paste supplying method of the embodiment of the present invention.

DESCRIPTION OF THE PREFERRED EMBODIMENTS

Figure 1:
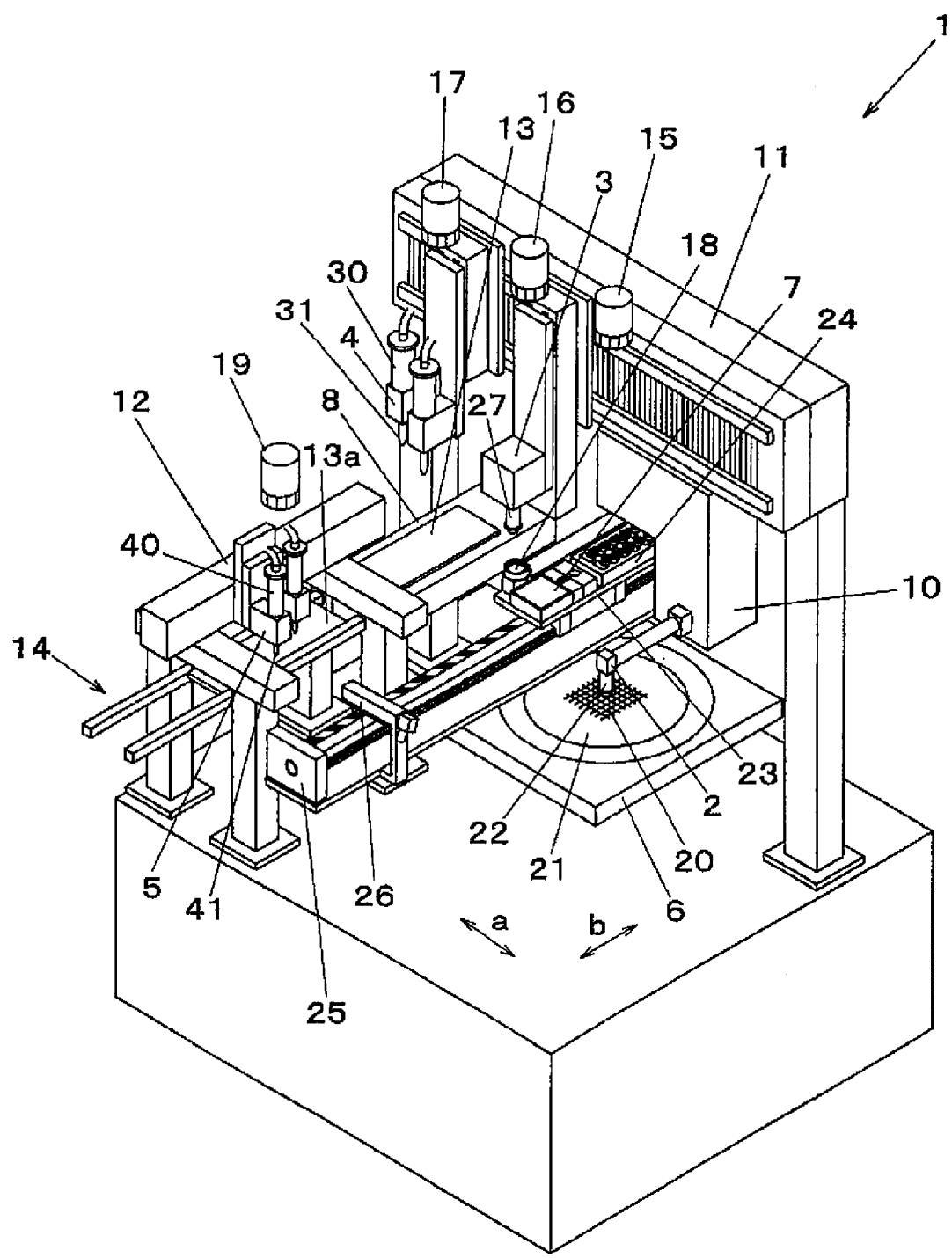
FIG. 1 is an oblique perspective view of an electronic component mounting apparatus of an embodiment of the present invention.

An embodiment of the present invention is now described by reference to the drawings. As shown in FIG. 1, an electronic component mounting apparatus 1 has, as principal sections, four working heads including a pickup head 2, a bonding head 3, a first drawing head 4, and a second drawing head 5; three working tables including a component supply table 6, a component relay table 7, and a mounting table 8; a movement mechanism 10 that moves the pickup head 2; a movement mechanism 11 that moves the bonding head 3 and the first drawing head 4; a movement mechanism 12 that moves the second drawing head 5; a substrate conveyance mechanism 14 that conveys a substrate 13; and five cameras 15, 16, 17, 18, and 19.

The pickup head 2, the bonding head 3, and the first drawing head 4 are arranged in this sequence from a front surface side to a rear surface side of the electronic component mounting apparatus 1 in a depthwise direction (as designated by an arrow "a"). The second drawing head 5 is arranged at a conveyance starting side of the mounting table 8 in a direction of conveyance of the substrate 13 (an arrow "b" orthogonal to the arrow "a" within a horizontal plane). The component supply table 6, the component relay table 7, and the mounting table 8 are arranged in this sequence from the front to the rear of the electronic component mounting apparatus 1 in the depthwise direction (as designated by the arrow "a"). The pickup head 2, the bonding head 3, and the first drawing head 4 can move in the depthwise direction (as designated by the arrow "a") of the electronic component mounting apparatus 1, and the second drawing head 5 can move in the depthwise direction (as designated by the arrow "a") of the electronic component mounting apparatus 1 and a direction orthogonal to the depthwise direction within the horizontal plane.

The pickup head 2 conveys chips 20 supplied from the component supply table 6 to the component relay table 7. The plurality of chips 20 affixed to a wafer sheet 21 are held on the component supply table 6. The pickup head 2 attracts each of the chips 20 with a nozzle 22 by suction, to thus peel the chip 20 away from the wafer sheet 21.

The first camera 15 is a camera for recognizing a position of each of the chips 20 located before picked up. When the chip 20 recognized by means of image analysis deviates from a regular chip in terms of a position and an orientation, a correction is made to the position and angle of the nozzle 22 and the position of the component supply table 6. After the nozzle 22 and the chip 20 have been positionally aligned to each other, the nozzle 22 picks up the chip 20.

The component relay table 7 is arranged on a movable table 23 along with a nozzle stocker 24 and the second camera 18. The movable table 23 can move in the direction of conveyance of a substrate (as designated by the arrow "b") by a rectilinearly movable device 25. A cleaning head 26 is disposed in a travel pathway of the movable table 23. When the movable table 23 moves immediately below the cleaning head 26, the cleaning head 26 cleans up an upper surface of the component relay table 7 (a chip mounting surface) or eliminates an unwanted chip.

The bonding head 3 mounts the chip 20 on the substrate 13. The substrate conveyance mechanism 14 conveys the substrate 13 into the mounting table 8 and fixed on the mounting table 8. The bonding head 3 picks up the chip 20 from the component supply table 6 and the component relay table 7 by means of a nozzle 27 attached to the bonding head 3. In the case of flip-chip mounting, the inverted chip 20 is directly received from the pickup head 2 with its nozzle 22 oriented upwardly.

The third camera 16 is a camera for recognizing the position of the chip 20 on the component relay table 7. When the chip 20 recognized by means of image analysis deviates from a regular chip in terms of a position and an orientation, a correction is made to the position and angle of the nozzle 27 and the position of the component relay table 7. After the nozzle 27 and the chip 20 have been positioned, the nozzle 27 picks up the chip 20. In the case of flip-chip mounting, the chip 20 attracted by the nozzle 27 by suction is photographed by the second camera 18, thereby ascertaining the position and orientation of the chip.

The first drawing head 4 squirts a paste-like adhesive (hereinafter abbreviated as a "paste") preserved in a syringe 30 from a nozzle 31 attached to a lower end of the head, to thus supply the paste to the substrate 13 situated at a lower position. The substrate 13 is conveyed into the mounting table 8 by means of the substrate conveyance mechanism 14 and fixed on the mounting table 8. The first drawing head 4 and the substrate 13 can linearly travel in mutually orthogonal directions. Therefore, an arbitrary shape can be drawn on the substrate 13 by means of the paste, by ejecting the paste while the position of the first drawing head 4 and the position of the substrate 13 are relatively changed.

The mounting table 8 works as a mounting position where the chip 20 is mounted, as well as the position where the substrate 13 is supplied with the paste. Since the first drawing head 4 and the bonding head 3 perform operations of different specifics at the same position, either the first drawing head 4 or the bonding head 3 must be caused to recede to a position where a remaining does not interfere with operation of an operating one during action of the operating one. Therefore, the first drawing head 4 approaches the substrate 13 from the rear surface side of the electronic component mounting apparatus 1 and recedes toward the rear surface side after drawing operation. The bonding head 3 approaches the substrate 13 from its front surface side and recedes toward a front surface side after mounting operation.

The fourth camera 17 is a camera for ascertaining the shape of the paste supplied to the substrate 13 and acts also as a camera for ascertaining a mounting position on the substrate 13 and the position of the chip 20 mounted on the supplied paste. Therefore, the fourth camera 17 has a function of automatically adjusting a focal length in accordance with a different subject.

The second drawing head 5 supplies, as does the first drawing head 4, the paste to a substrate 13*a* located below the head by squirting the paste preserved in a syringe 40 from a nozzle 41 attached to a lower end of the syringe. The substrate 13*a* is a substrate that is located at a pre-paste supply position and that waits for being conveyed to the mounting table 8. The second drawing head 5 squirts the paste while being horizontally moved by the movement mechanism 12, thereby being able to draw an arbitrary shape at an arbitrary position on the substrate 13*a* by means of the paste. In order to ascertain a paste supply position on the substrate 13*a* and the state of the supplied paste, the fifth camera 19 is placed at a position above the second drawing head 5.

Figure 2:
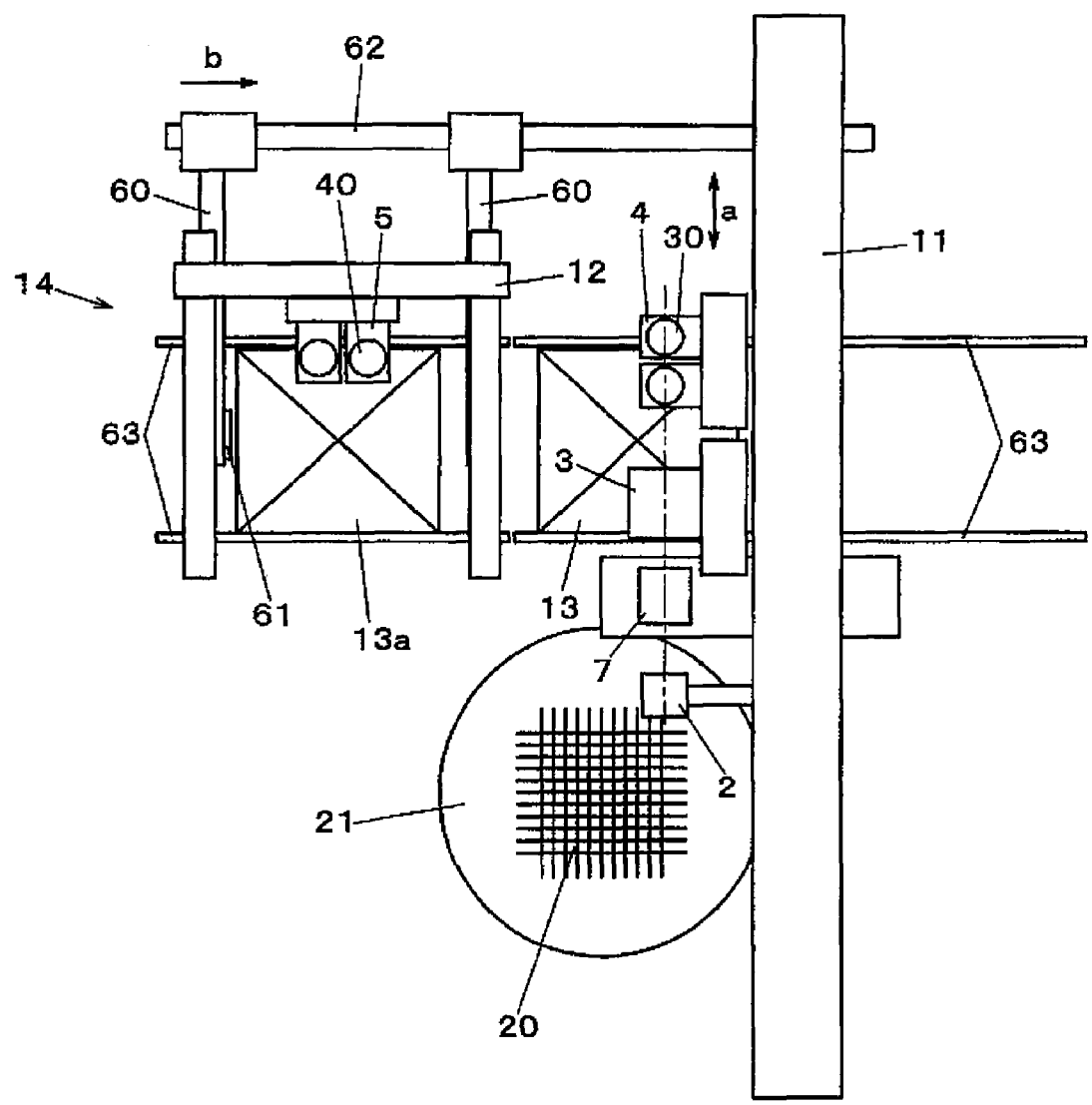
FIG. 2 is a plan view of the electronic component mounting apparatus of the embodiment of the present invention.

As shown in FIG. 2, the substrate conveyance mechanism 14 brings a claw 61 provided at a leading end of an arm 60 into contact with a rear end of the substrate and conveys the substrate by moving the arm 60 along a guide 62 in a direction of conveyance of the substrate (designated by an arrow "b"). The substrates 13 and 13*a* are regulated by rails 63 placed on both sides of the substrates in terms of the direction of conveyance.

The substrate 13 located at the mounting position is already provided with the paste previously supplied at the pre-paste supply position with the second drawing head 5 as well as with the paste drawn by the first drawing head 4. Hence, the bonding head 3 mounts the chip 20 on the paste previously supplied at the pre-paste supply position and also mounts another chip 20 on the paste subsequently supplied at the mounting position. So long as the paste is of a type that allows occurrence of a time difference in a period from when the paste is drawn until when a chip is mounted on the paste, the chip 20 can be mounted immediately after conveyance of the substrate to the mounting position, by means of previously supplying the paste at the pre-paste supply position during a waiting period.

A paste supply method for a case where two types of paste, namely, quick-drying paste and slowly-drying paste, are supplied to one substrate is now described by reference to FIGS. 3A to 3F. The substrate 13 is a multiple board to be finally divided into four substrates. The substrate 13 is to be subjected to mounting of three types of chips, and two chips 20*a* and 20*b* of the three types of chips are mounted by use of slowly-drying paste. A remaining one is a chip 20*c* requiring a high heat radiation characteristic and mounted by use of paste containing a large proportion of Ag exhibiting high thermal conductivity.

The substrate 13 shown in FIG. 3A is conveyed to the pre-paste supply position. As shown in FIG. 3B, while the substrate 13 waits for being conveyed to the mounting position, the second drawing head 5 supplies paste 70 and 71 to locations where chips 20*a* and 20*b* are to be mounted. When preparation for conveying a new substrate to the mounting position is made, the substrate 13 is conveyed to the mounting position. As shown in FIG. 3C, the chips 20*a* and 20*b* are mounted to the paste 70 and 71 from above. Next, paste 72 is supplied to a location where a chip 20*c* is to be mounted. Since the paste 72 is quick-drying paste containing a large proportion of Ag, the paste is supplied to one location at a time as shown in FIG. 3D. The chip 20*c* is mounted on the location thus supplied with the paste, as shown in FIG. 3E. A round of operations involving supplying paste and mounting action is performed four times, whereby mounting of all the chips 20*a*, 20*b*, and 20*c* is completed as shown in FIG. 3F.

As mentioned above, since the electronic component mounting apparatus 1 can supply paste at two locations; namely, the mounting position and the pre-paste supply position. Hence, so long as the electronic component mounting apparatus 1 is used, it is possible to select a supplying method that maximizes production efficiency according to the type and property of paste. In particular, when slowly-drying paste and quick-drying paste are simultaneously used for one substrate, the slowly-drying paste is supplied at the pre-paste position, and the quick-drying paste is supplied at the mounting position, whereby a wait time is effectively utilized, and a time during which the substrate stays at the mounting position can be shortened, so that production efficiency is significantly enhanced.

In addition to the drawing head, a stamping head for stamping paste affixed to a stamping pin to a substrate can also be used as a paste supply section that supplies a substrate with paste.

Also, although the first drawing head 4 supplies the substrate 13 with paste at the mounting position and the second drawing head 5 supplies the paste to the substrate at the pre-paste supply position in this embodiment, the first drawing head 4 can supply a paste over an upper side of an electronic element provided on the substrate 13 at the mounting position and the second drawing head 5 can supply a paste over an upper side of the electronic element provided on the substrate 13*a* at the pre-paste supply position. In this case, the substrate conveyance mechanism 14 can convey the electronic element provided on substrates, the electronic component mounting apparatus 1 can mount the chip onto the upper face of the electronic element supplied with the paste at the mounting position.

The present invention enables supplying of paste at two positions; namely, a mounting position and a pre-paste supply position. Therefore, it is possible to select a supplying method that maximizes production efficiency according to type and property of paste. Hence, the present invention is useful in a field where electronic components are mounted after paste has been supplied to a substrate.

What is claimed is:

1. An electronic component mounting method for conveying a substrate from a second position to a first position and mounting an electronic component on the substrate or an electronic element provided on the substrate that is positioned at the first position by a mounting head, the method comprising the steps of:
   supplying a first paste to the substrate or the electronic element at the second position;
   conveying the substrate to the first position;
   supplying the substrate or the electronic element with a second paste at the first position; and
   mounting an electronic component on the substrate or the electronic element supplied with the first and second pastes by the mounting head.

2. The electronic component mounting method according to claim 1, wherein the first position is a mounting position and the second potion is a pre-paste supply position.

3. The electronic component mounting method according to claim 1, wherein a first area of the substrate or the electronic element to which the first paste is supplied at the second position is different from a second area of the substrate or the electronic element to which the second paste is supplied at the first position.

4. The electronic component mounting method according to claim 1, wherein the first paste is a slowly-drying paste and the second paste is a quick-drying paste.

* * * * *